(12) United States Patent
Xia et al.

(10) Patent No.: US 7,447,020 B2
(45) Date of Patent: Nov. 4, 2008

(54) HEAT SINK ASSEMBLY

(75) Inventors: Wan-Lin Xia, Guangdong (CN); Tao Li, Guangdong (CN); Min-Qi Xiao, Guangdong (CN)

(73) Assignees: Fu Zhun Precision Industry (Shen Zhen) Co., Ltd., Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 373 days.

(21) Appl. No.: 11/306,499

(22) Filed: Dec. 30, 2005

(65) Prior Publication Data

US 2007/0035926 A1 Feb. 15, 2007

(30) Foreign Application Priority Data

Aug. 12, 2005 (CN) .................. 2005 1 0036585

(51) Int. Cl.
*H05K 7/20* (2006.01)

(52) U.S. Cl. ....................... 361/695; 361/697

(58) Field of Classification Search ........... 361/695, 361/697
See application file for complete search history.

(56) References Cited

U.S. PATENT DOCUMENTS

| | | | | | |
|---|---|---|---|---|---|
| 5,353,863 | A | * | 10/1994 | Yu .............................. | 165/80.3 |
| 5,630,469 | A | * | 5/1997 | Butterbaugh et al. ........ | 165/80.3 |
| 6,301,901 | B1 | * | 10/2001 | Coffee et al. ................... | 62/3.7 |
| 6,304,445 | B1 | * | 10/2001 | Bollesen ...................... | 361/697 |
| 6,496,368 | B2 | * | 12/2002 | Jui-Yuan ...................... | 361/697 |
| 6,542,364 | B2 | * | 4/2003 | Lai et al. ...................... | 361/697 |
| 6,711,016 | B2 | * | 3/2004 | Chung et al. ................. | 361/695 |
| 6,768,641 | B2 | * | 7/2004 | Li ................................ | 361/719 |
| 6,779,595 | B1 | * | 8/2004 | Chiang .................. | 165/104.33 |
| 6,938,682 | B2 | * | 9/2005 | Chen et al. ............. | 165/104.33 |
| 6,958,915 | B2 | * | 10/2005 | Wang et al. .................. | 361/709 |
| 6,967,845 | B2 | * | 11/2005 | Chiang et al. ................ | 361/709 |
| 7,040,384 | B2 | * | 5/2006 | Shiang-Chich .............. | 165/122 |
| 7,073,568 | B2 | * | 7/2006 | Chen et al. ............. | 165/104.33 |
| 7,130,192 | B2 | * | 10/2006 | Wang et al. .................. | 361/697 |
| 7,333,332 | B2 | * | 2/2008 | Wang .......................... | 361/700 |
| 2002/0043360 | A1 | * | 4/2002 | Lee ............................. | 165/80.3 |
| 2003/0202327 | A1 | * | 10/2003 | Chung et al. ................. | 361/697 |
| 2004/0066628 | A1 | * | 4/2004 | Liu .............................. | 361/704 |
| 2004/0174675 | A1 | * | 9/2004 | Liu .............................. | 361/687 |
| 2005/0073811 | A1 | * | 4/2005 | Wang et al. .................. | 361/688 |
| 2005/0087329 | A1 | * | 4/2005 | Zhang et al. ........... | 165/104.33 |
| 2005/0088819 | A1 | | 4/2005 | Chen et al. | |

FOREIGN PATENT DOCUMENTS

| | | |
|---|---|---|
| CN | 2466700 Y | 12/2001 |
| CN | 2558191 Y | 6/2003 |
| CN | 1582102 A | 2/2005 |

* cited by examiner

*Primary Examiner*—Anatoly Vortman
(74) *Attorney, Agent, or Firm*—Winston Hsu (57) ABSTRACT

A heat sink assembly includes a heat sink (10), a fan cover (20) mounted on the heat sink and a fan (30) carried by the fan cover. The heat sink comprises a base (12) and a plurality of spaced heat dissipation fins (140) extending from the base. The spaced heat dissipation fins define a plurality of channels (16) extending through front and rear ends of the heat sink. A cavity (40) is formed between the front end of the heat sink and the fan cover. The front end of the heat sink is configured with an arced front edge or an inclined front edge.

16 Claims, 9 Drawing Sheets

HEAT SINK ASSEMBLY

DESCRIPTION

1. Field of the Invention

The present invention relates to a heat sink assembly, and more particularly to a heat sink assembly which provides a fan and a heat sink having a plurality of fins, wherein the fins are so configured that an airflow generated by the fan can evenly flow through the fins to effectively take heat away from the fins, thereby promoting heat dissipating efficiency of the heat sink assembly.

2. Description of Related Art

Usually, a conventional heat dissipation device placed inside of a computer enclosure comprises a heat sink defining a plurality of spaced cooling fins and a fan. The spaced cooling fins form a plurality of channels extending from one end of the heat sink to the other end thereof. The fan is mounted directly to the heat sink and used to generate a forced airflow flowing through the channels between opposite ends of the heat sink. In this type of the heat dissipation device, some of the cooling fins are removed to create a space for accommodating the fan. This enables the fan to be close to the heat sink and saves space of the whole heat dissipation device to make the heat dissipation device more compact. However, the forced airflow mainly passes through the part of the heat sink that the fan directly faces. That is to say, most forced airflow flows through the middle channels of the heat sink, and little airflow passes through the two lateral sides of the heat sink where the fan does not directly face. So limitation of the forced airflow flowing to the lateral sides of the heat sink, whereby the force airflow cannot evenly flow through all of the channels to have a thorough contact with the cooling fins. Accordingly, heat dissipation efficiency of the heat dissipation device is low.

In order to solve the above problems, a fan cover is required. The fan cover carries the fan at one side thereof and is mounted onto a heat sink. The fan cover creates a distance between the fan and the heat sink, avoiding the fan being directly attached to the heat sink. When a fan cover is used, it is no longer necessary to remove away some part of the cooling fins of the heat sink to create a space for the fan. So, the heat dissipation device with a fan cover is widely used. However, even if a fan cover is used, a forced airflow generated by the fan cannot evenly flow through channels formed between the fins to effectively take heat away from the fins.

SUMMARY OF INVENTION

A heat sink assembly in accordance with a preferred embodiment of the present invention comprises a heat sink, a fan cover mounted on the heat sink and a fan carried by the fan cover. The heat sink comprises a base and a plurality of spaced heat dissipation fins extending from the base. The spaced heat dissipation fins define a plurality of channels extending from a front end to a rear end of the heat sink. A cavity is formed between the front end of the heat sink and the fan cover. The front end of the heat sink has an arced shape with a convex pointing towards the fan cover, whereby each of upper and lower regions of the cavity has the largest space than any other region of the cavity. By such a design, a forced airflow produced by the fan entering the cavity has a portion flowing upwardly and downwardly to reach the upper and lower regions of the cavity, and, thereafter, entering into the channels of the heat dissipation fins. Accordingly, the forced air flow evenly flows through the channels and has a thorough contact with the fins to take heat away from the fins.

Other advantages and novel features will become more apparent from the following detailed description of preferred embodiments when taken in conjunction with the accompanying drawings, in which:

DETAILED DESCRIPTION

Reference will now be made to the drawings to describe the present invention in detail.

FIGS. 1-4 and 7 illustrate a heat sink assembly in accordance with a preferred embodiment of the present invention. The heat sink assembly comprises a heat sink 10, a fan cover 20 mounted on a lateral side of the heat sink 10 and carrying a fan 30 on a lateral side of the fan cover 20. The heat sink 10 comprises a heat receiver such as a base 12 and a heat dissipation fins group 14 attached on the base 12. The base 12 defines a pair of screw holes 122 therein. The heat dissipation fins group 14 defines a plurality of spaced heat dissipation fins 140 and a plurality of channels 16 each extending between two adjacent heat dissipation fins 140 and from a front end to a rear end of the heat dissipation fins group 14. Each heat dissipation fin 140 comprises an arc-shaped front end 142, a hook 144 at an upper side of the heat dissipation fin 140 near the arc-shaped front end 142 and a flange 146 at the upper side of the heat dissipation fin 140 behind the hook 144. All the arc-shaped front ends 142 form a convex at the front end of the heat dissipation fins group 14. All the flanges 146 and hooks 144 respectively form first and second planes (not labeled) on top of the heat dissipation fins group 14. There is a cutout 145 (shown in FIG. 7) between the hook 144 and the flange 146 of each heat dissipation fin 140. All the cutouts 145 define a slot 18 between the first and second planes.

The fan cover 20 comprises a body 22, and three walls extending from the body 22, namely a pair of baffles 24 extending rearwards from a pair of opposite lateral sides of the body 22, and a top cover 25 extending rearwards from top of the body 22. A pair of claws 28 extends forwards from bottom of the body 22. The body 22 defines an opening 27 in a middle thereof and four screw holes 220 at four corners of the opening 27. The claws 28 extend from two opposite sides of the opening 27 and are located on the screw holes 122 of the base 12, respectively. Each claw 28 further defines a hole 280 therein in alignment with a corresponding screw hole 122, whereby two screws (not shown) can be used to extend through the holes 280 and screw into the screw holes 122, thereby fastening the fan cover 20 to the base 12. The top cover 25 forms a flap 26 at a free end thereof for inserting in the slot 18 and the flap 26 extends along a direction parallel to the body 22. The baffles 24 cooperate with the top cover 25 and the base 12 to enclose the front end of the heat dissipation fins group 14 with the arc-shaped front ends 142. A cavity 40 is formed between the fan cover 20 and the front end of the heat dissipation fins group 14 with the arc-shaped front ends 142.

The fan 30 defines four holes 32 at four corners thereof corresponding to the screw holes 220. Four screws (not shown) are used to extend through the four holes 32 and screw into to the screw holes 220, thereby fastening the fan 30 to the fan cover 20. The fan 30 faces to the opening 27 so that a forced airflow generated by the fan 30 enters the cavity 40 through the opening 27.

The forced airflow entering the cavity 40 first encounters the arc-shaped front ends 142 of the heat dissipation fins 140. Because of the arc-shaped structure of the arc-shaped front ends 142, the cavity 40 has a space in a middle which is smaller than a space in either of top and bottom of the cavity 40. The forced airflow entering the cavity 40 has a portion entering the channels 16 from the middle of the cavity 40 and another portion flowing along a contour of the arc-shaped front ends 142 to leave from the middle of the cavity 40 and enter the top and bottom thereof (shown as arrows in FIG. 4). Then from the top and bottom of the cavity 40, the another portion of the forced airflow enters the channels 16. Accordingly, the forced airflow can more evenly flow through the channels 16 and thoroughly contact with the heat dissipation fins 140. Thus, the forced airflow can more effectively take heat away from the heat dissipation fins 140 when the airflow flows through the rear end of the heat dissipation fins group 14. The heat of the heat dissipation fins 140 comes from the base 12 which is in thermal contact with a heat-generating electronic component, such as a central processing unit (CPU). The heat dissipation fins 140 are soldered to the base 12.

Figure 1:
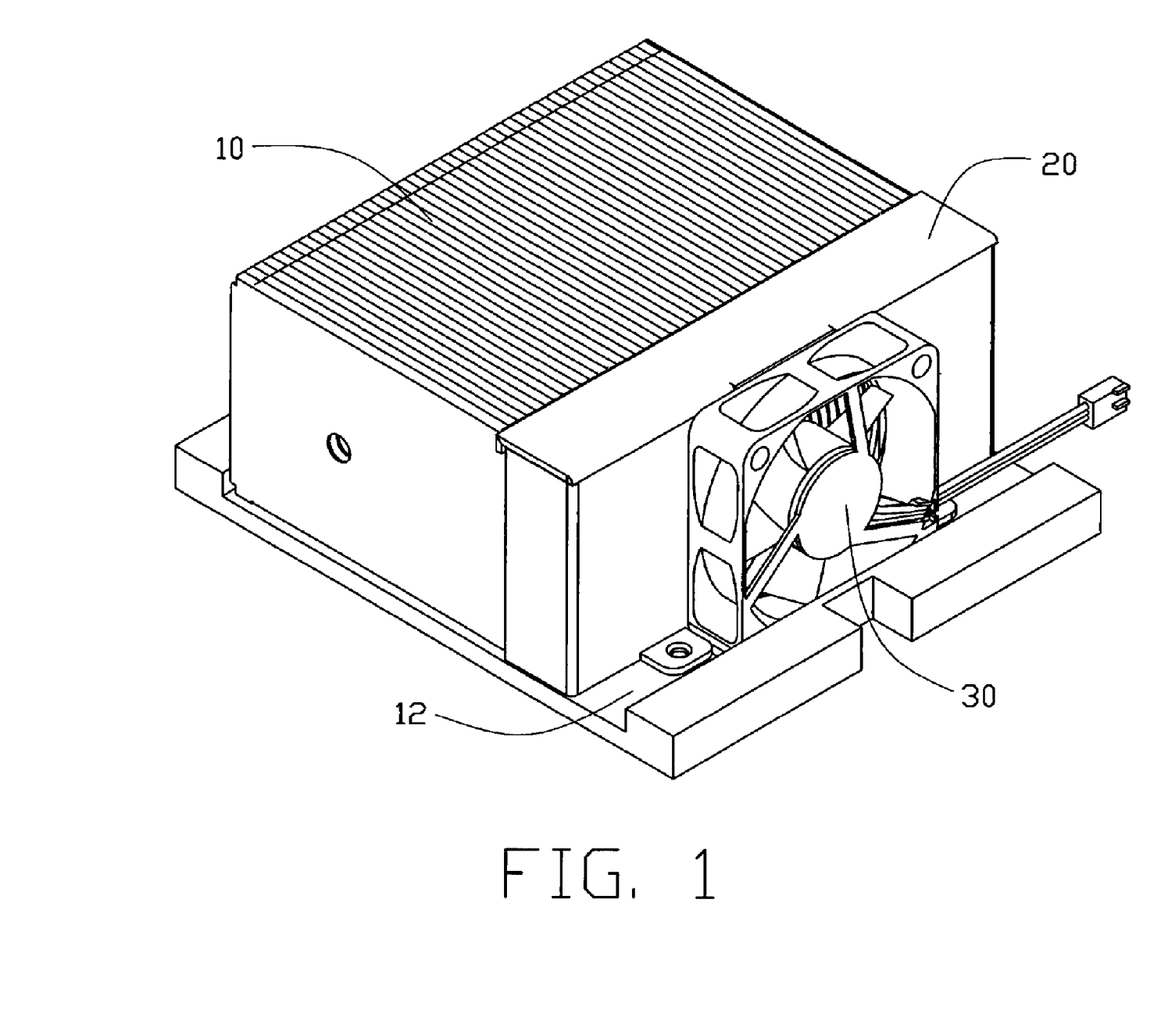
FIG. 1 is an assembled view of a heat sink assembly in accordance with a preferred embodiment of the present invention comprising a heat sink with heat dissipation fins, a fan and a fan cover carrying the fan.
Figure 2:
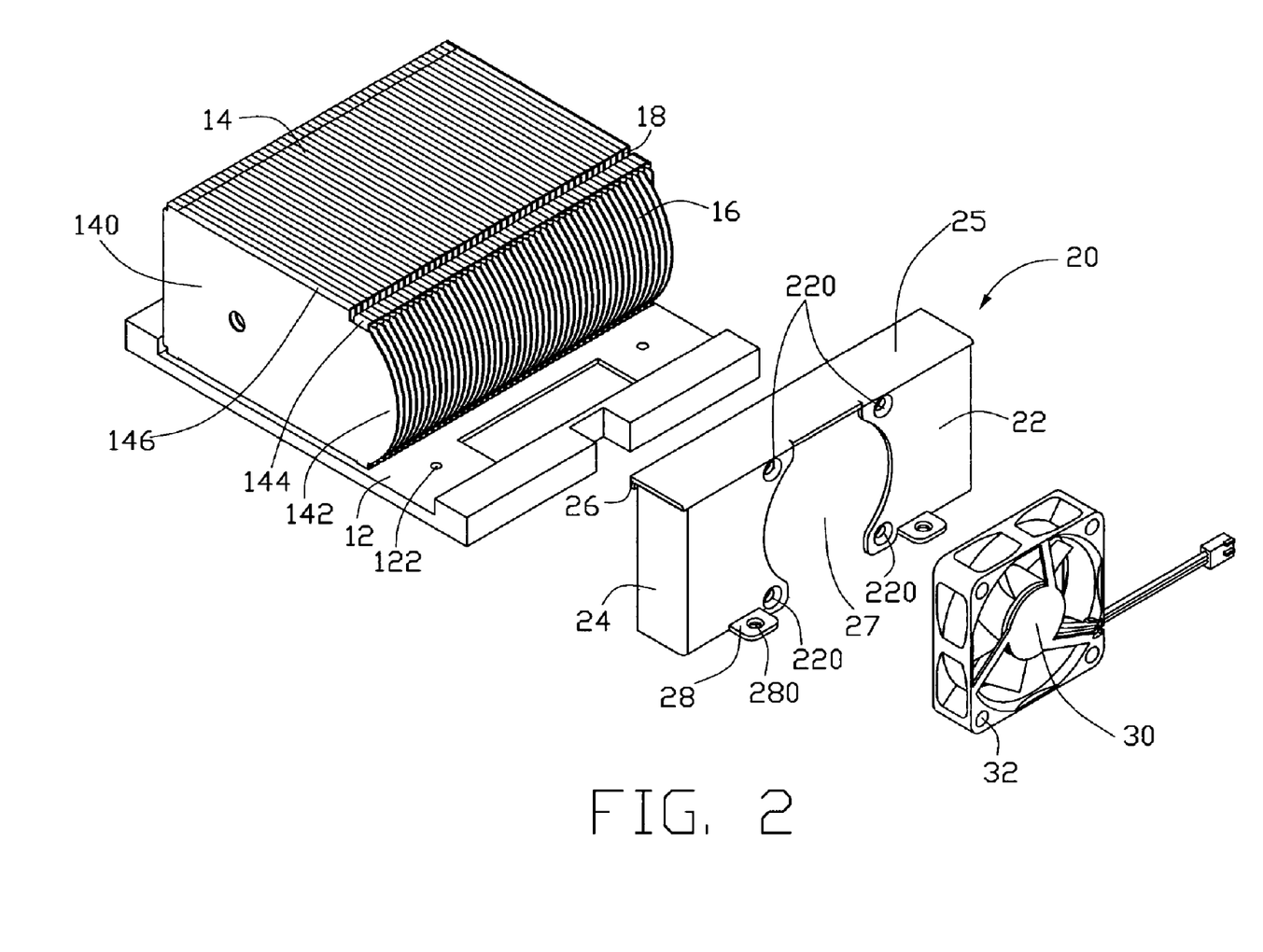
FIG. 2 is an exploded view of FIG. 1.
Figure 3:
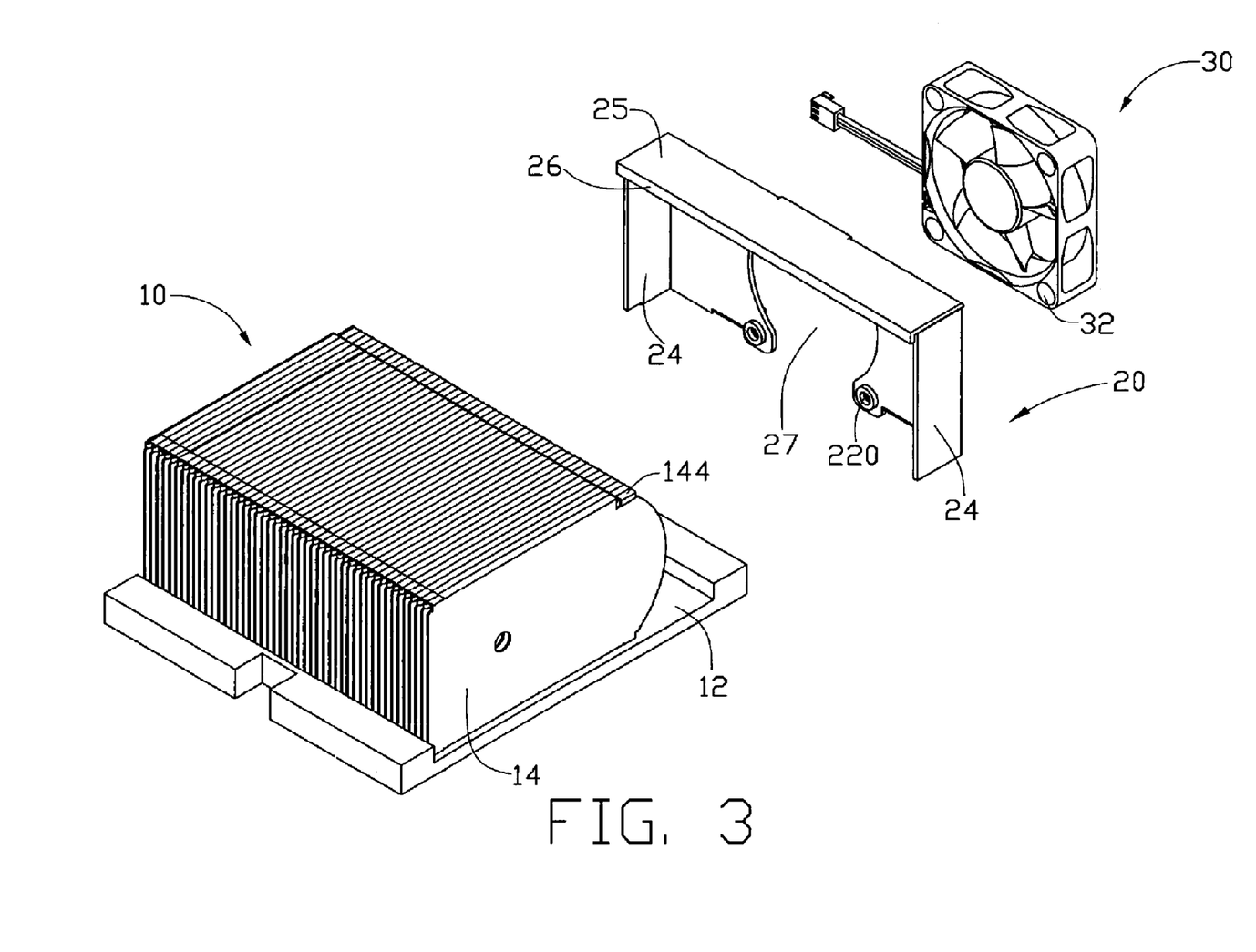
FIG. 3 is a view similar to FIG. 2, but taken from a different aspect.
Figure 4:
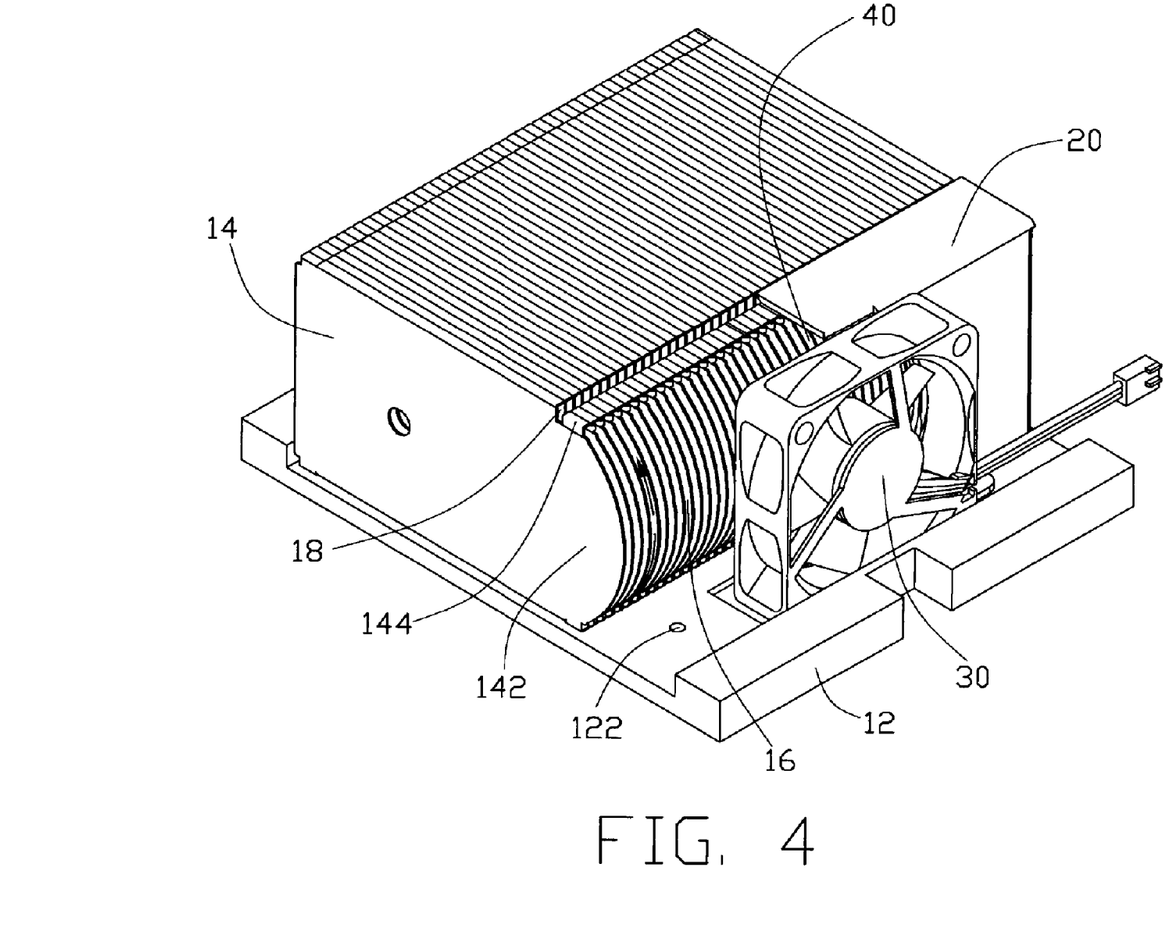
FIG. 4 is a view similar to FIG. 1 with some parts thereof removed to more clearly show relationship between the fan cover and the heat sink.
Figure 5:
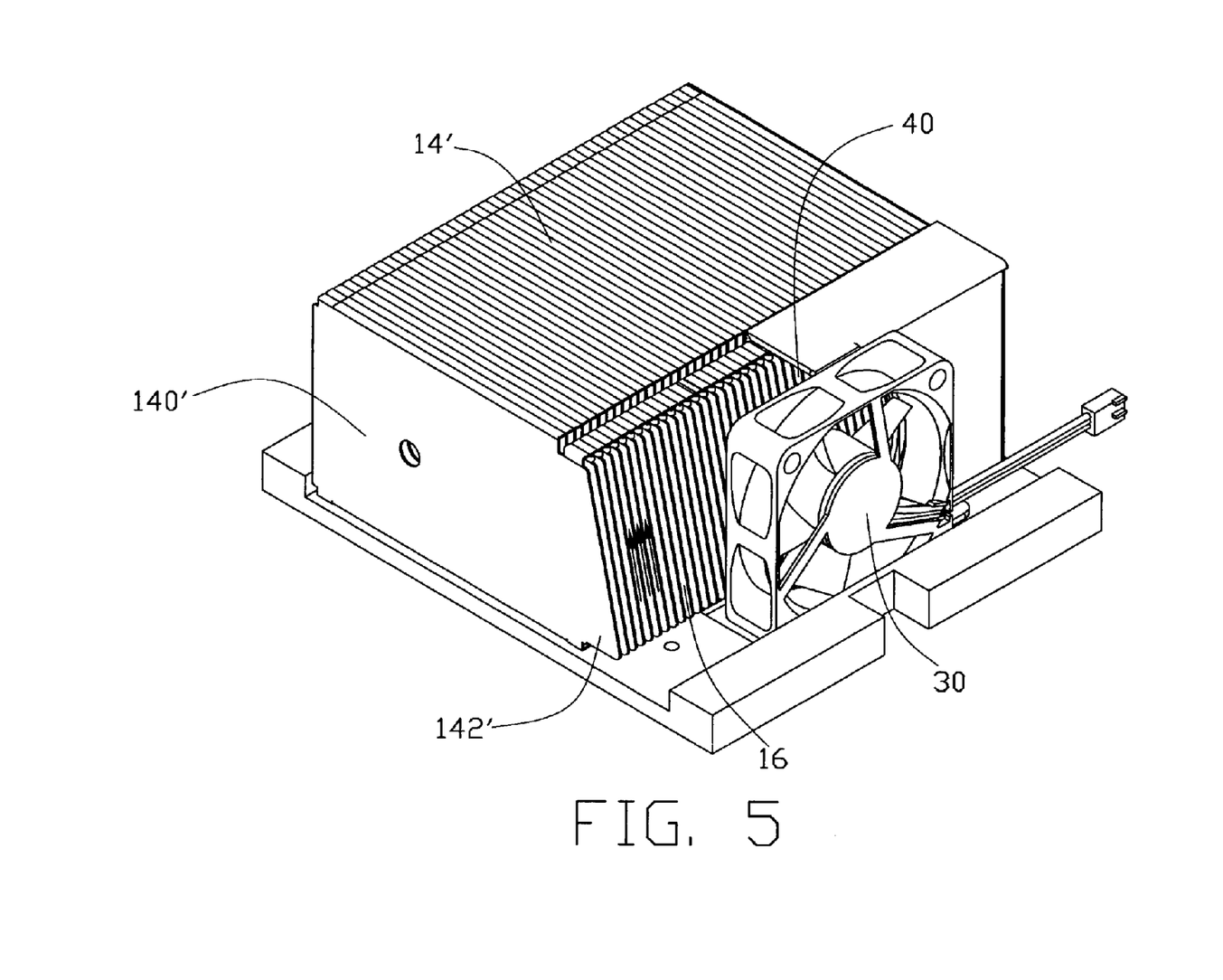
FIG. 5 is a view similar to FIG. 4, but showing a heat sink assembly in accordance with another embodiment of the present invention.
Figure 8:
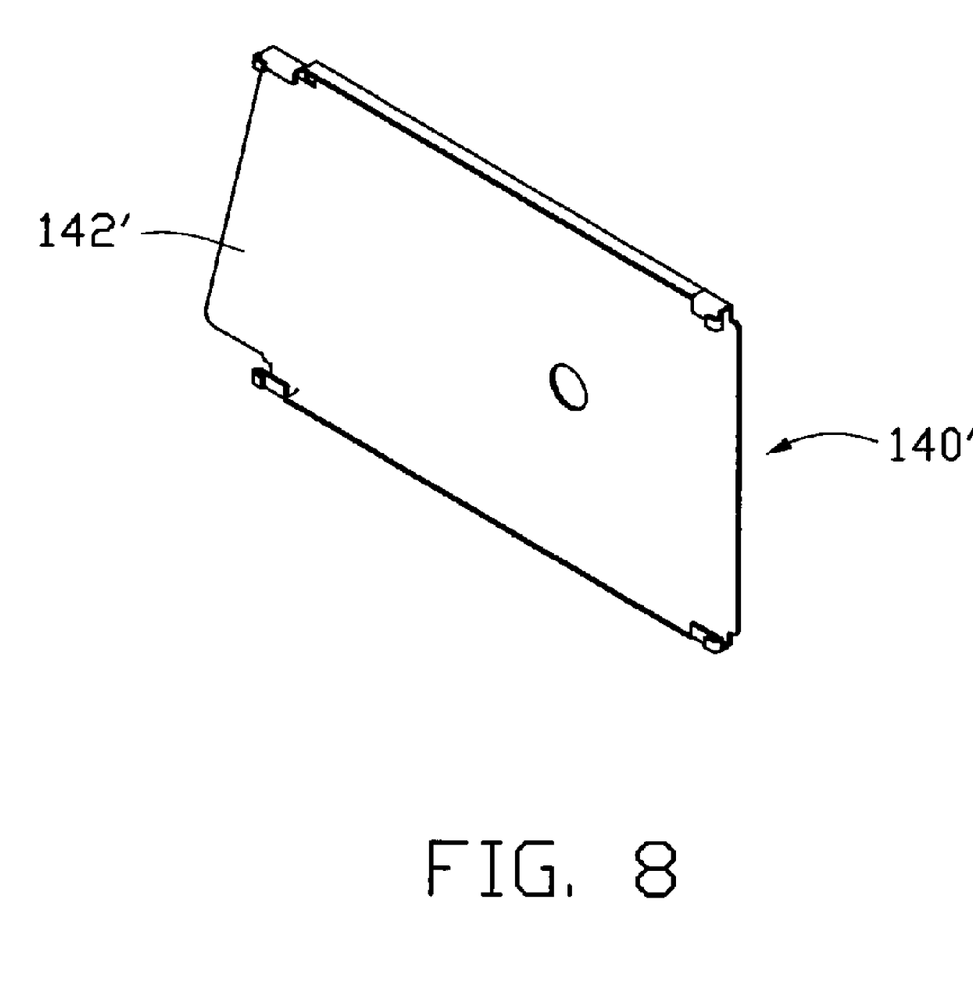

Referring to FIGS. 5 and 8, a heat sink assembly is shown in accordance with another embodiment of the present invention. This second embodiment is substantially the same as the first embodiment, except that the second embodiment has a heat dissipation fins group 14' which is different from the heat dissipation fins group 14. The heat dissipation fins group 14' comprises a plurality of heat dissipation fin 140'. Each heat dissipation fin 140' comprises a triangle-shaped front end 142'. All triangle-shaped ends 142' form an inclined plane at the front end of the heat sink dissipation fins group 14'. The inclined plane inclines forwards from top to bottom of the heat sink dissipation fins group 14'. The inclined plane renders the bottom of the cavity 40 to have the smallest space than any other portion of the cavity 40, and the top of the cavity to have the largest space. The forced airflow entering the cavity 40, in addition to entering the channels between the heat dissipation fins 140', has a portion flowing along a direction from bottom of the triangle-shaped end 142' to top thereof (shown as arrows in FIG. 5). From the top, the portion of the airflow enters the channels whereby the forced airflow generated by the fan can more evenly flow through the channels to take heat from the heat dissipation fins 140' so that the heat dissipating effectiveness of the heat sink assembly is enhanced.

Figure 6:
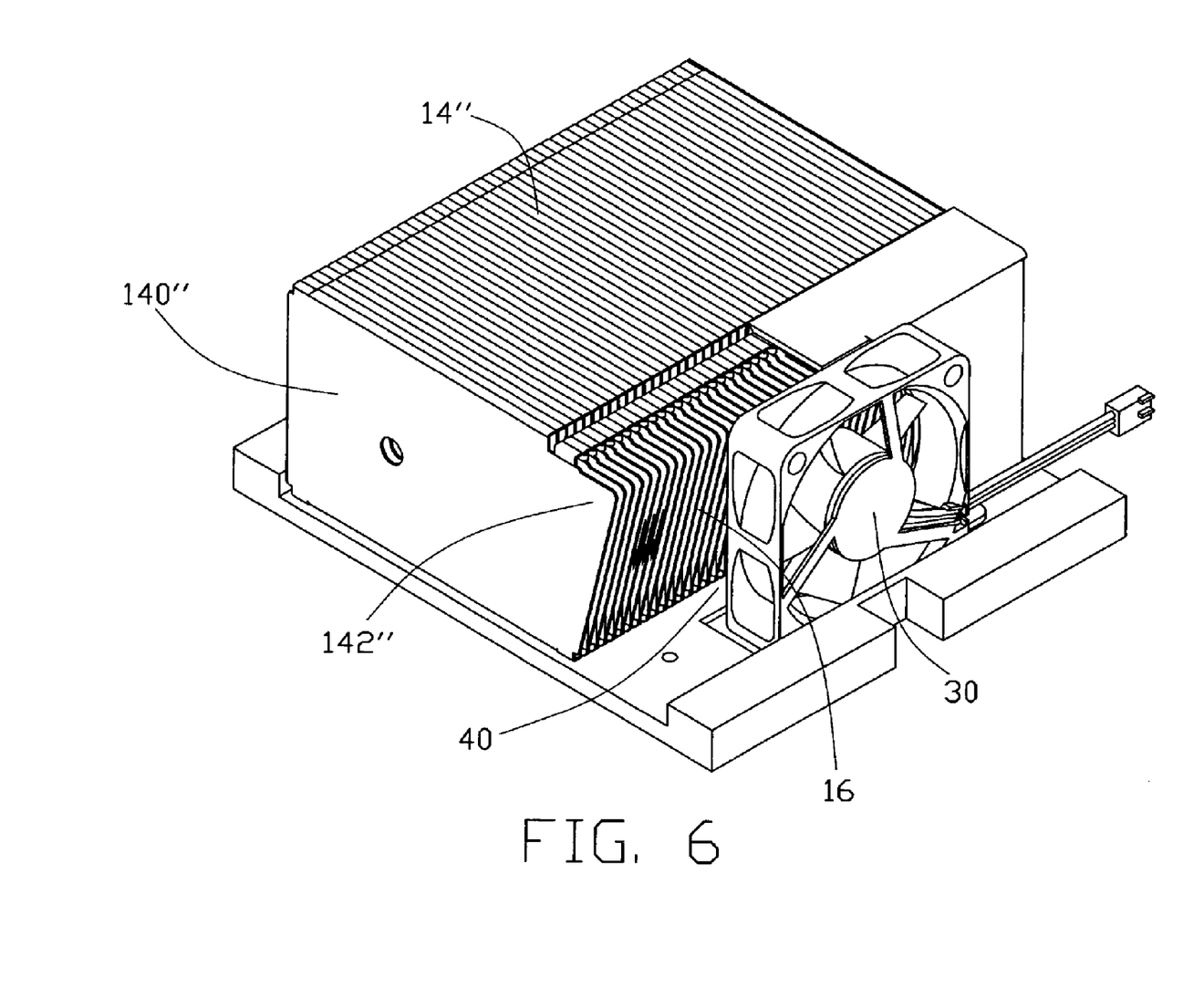
FIG. 6 is a view similar to FIG. 4, but showing a heat sink assembly in accordance with a third embodiment of the present invention.
Figure 7:
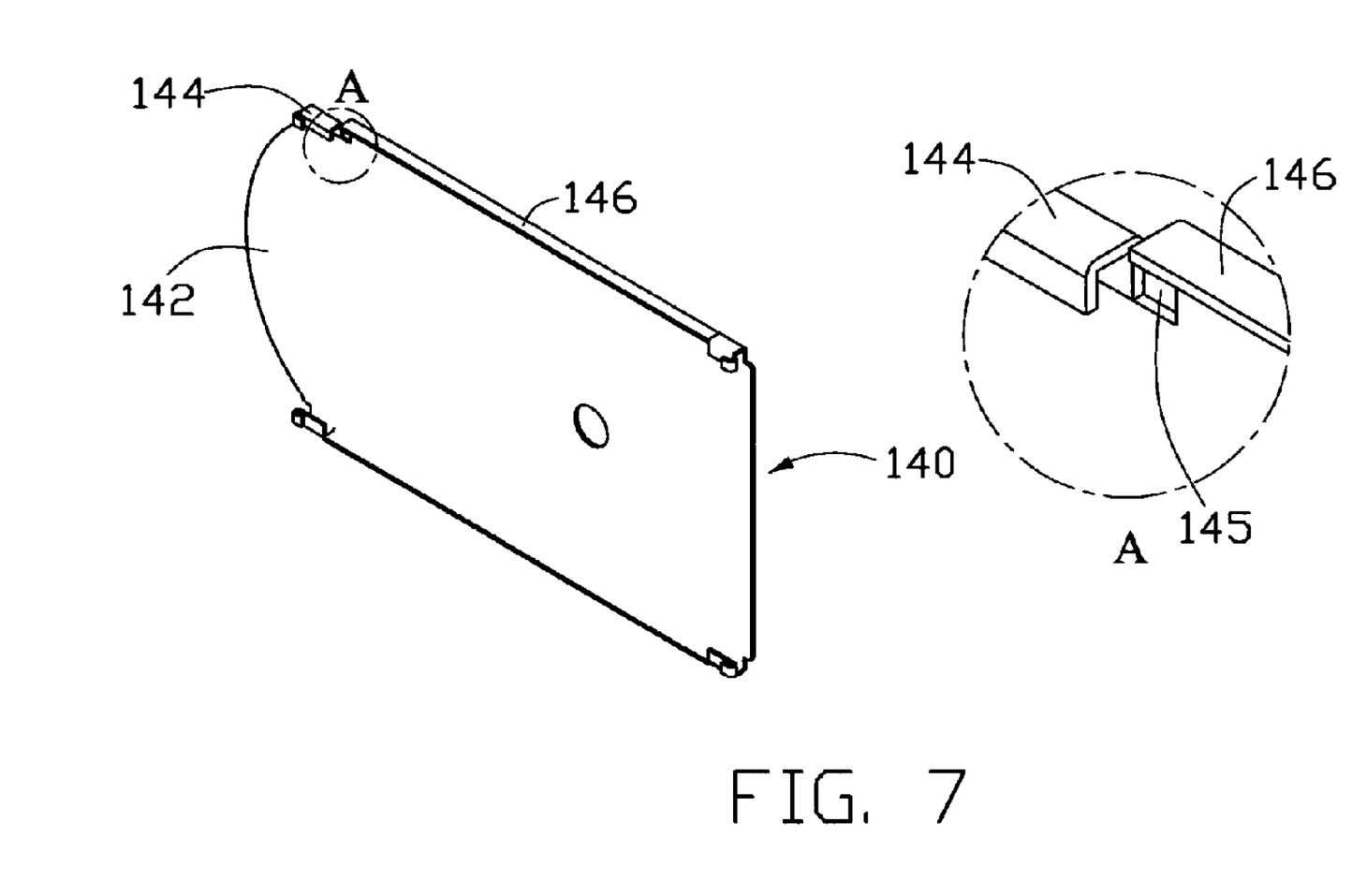
FIG. 7-9 are views of three kinds of the heat dissipation fins in the three embodiments of the present invention, respectively.
Figure 9:
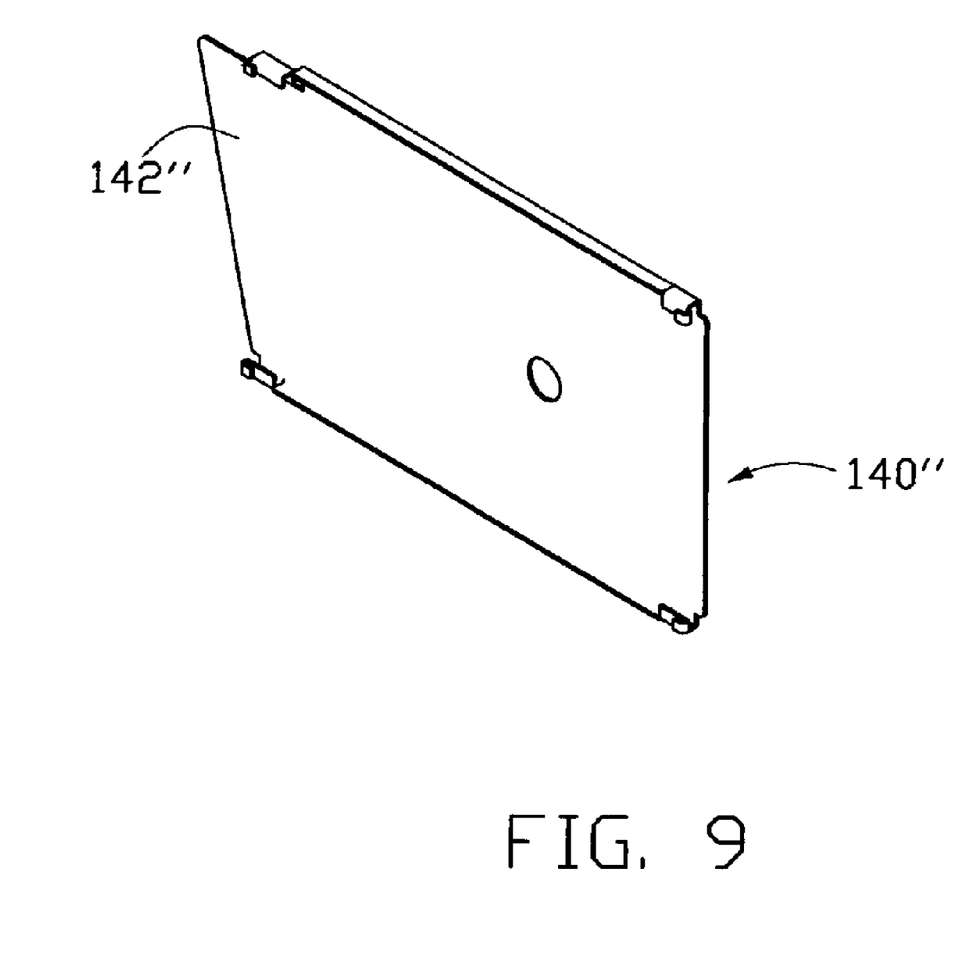

Referring to FIGS. 6 and 9, a heat sink assembly is shown in accordance with a third embodiment of the present invention with a heat dissipation fins group 14" which is distinguished from the heat dissipation fins groups 14, 14'. The heat dissipation fins group 14" comprises a plurality of heat dissipation fins 140". Each heat dissipation fin 140" comprises a triangle-shaped front end 142", which has a front inclined side inclining in a direction opposite to that of the triangle-shaped front end 142' of the heat dissipation fin 140'. All triangle-shaped front ends 142" form an inclined plane at the front end of the heat sink dissipation fins group 14". The inclined plane inclines rearwards from top to bottom of the heat sink dissipation fins group 14". The inclined plane renders the bottom of the cavity 40 to have the largest space than any other portion of the cavity 40. The forced airflow entering the cavity 40, in addition to flowing into the channels, has a portion thereof flowing along a direction from top of the triangle-shaped end 142" to bottom thereof (shown as arrows in FIG. 6). From the bottom, the portion of the airflow enters the channels, whereby the forced airflow entering the cavity 40 can more evenly flow through the channels to take heat of the heat dissipation fins 140" away; thus, the heat dissipating effectiveness of the heat dissipation assembly is improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly comprising:
    a heat receiver;
    a heat sink comprising a plurality of spaced heat dissipation fins, a plurality of channels between the heat dissipation fins;
    a fan cover secured to the heat receiver and the heat sink; and
    a fan carried by the fan cover, the fan producing a forced airflow through the fan cover to the heat dissipation fins;
    wherein a cavity is formed between one end of the heat sink and the fan cover and the forced airflow having a portion flowing along an outer edge of the end of the heat sink from a region of the cavity to another region of the cavity, two adjacent points on the outer edge of each heat dissipation fin respectively having different distances to the fan cover; and
    wherein the heat sink defines a slot at top thereof, the fan cover having a plate fitting in the slot thereby mounting the fan cover on the heat sink.

2. The heat sink assembly as claimed in claim 1, wherein the fan cover comprises a body and three walls extending from three sides of the body, the three walls cooperating with the heat receiver to enclose the end of the heat sink and form the cavity.

3. The heat sink assembly as claimed in claim 1, wherein each heat dissipation fin has an arc-shaped end, all the arc-shaped ends forming a convex at the end of the heat sink.

4. The heat sink assembly as claimed in claim 1, wherein each heat dissipation fin has an inclined front edge, all the inclined front edges forming an inclined plane at the end of the heat sink.

5. The heat sink assembly as claimed in claim 1, wherein the fan cover comprises a flap inserted in the slot to secure the fan cover onto the end of the heat sink.

6. The heat sink assembly as claimed in claim 5, wherein the fan cover further defines an opening, the fan facing the opening and the forced airflow flowing through the opening into the cavity.

7. The heat sink assembly as claimed in claim 1, wherein each heat dissipation fin forms a flange at a top side thereof, all the flanges forming a plane at top surface of the heat sink and the forced airflow flowing from the end of the heat sink to opposite end thereof.

8. A heat dissipation assembly comprising:

a base absorbing heat from an electronic component, the base defining a plurality of screw holes;

a heat dissipation fins group rested on the base, the heat dissipation fins group defining a slot at top thereof and having a front end and a rear end;

a fan holder enclosing the front end of the heat dissipation fins group, the fan holder comprising a flap engaging with the slot and a plurality of claws secured to the base by screws extending through the claws and screwing into the screw holes of the base to thereby secure the fan holder on the front end of the heat dissipation fins group; and a fan carried by the fan holder, the fan generating an airflow flowing through the heat dissipation fins group from the front end to the rear end thereof;

wherein a cavity is created between the front end of the heat dissipation fins group and the fan holder, the airflow passing through the fan holder, entering the cavity and evenly being distributed in the cavity, and two adjacent points at a front end of each heat dissipation fin respectively having different distances to the fan holder.

9. The heat sink assembly as claimed in claim 8, wherein the fan holder further comprises a body and three walls extending from three sides of the body to enclose the front end of the heat dissipation fins group, and distances of the two adjacent points at the front end of each heat dissipation fin to the body are different.

10. The heat sink assembly as claimed in claim 8, wherein a region of the cavity has the largest space than any other region of the cavity.

11. A heat sink assembly comprising:

a heat sink having a base for thermal contact with a heat-generating electronic component, a fins group extending upwardly from the base, the fins group defining a plurality of channels extending from a front end to a rear end of the fins group;

a fan cover mounted on the front end of the fins group wherein a cavity is defined between the fan cover and the front end of the fins group, the front end of the fins group being so configured that at least one portion of the cavity has the largest space than any other portion of the cavity; and a fan mounted on the fan cover, a forced airflow generated by the fan entering the cavity through the fan cover, a portion of the forced airflow into the cavity flowing along a front edge of the front end of the fins group to reach the at least one portion of the cavity having the largest space;

wherein a slot is defined in top of the fins group and the fan cover has a flap fitted into the slot.

12. The heat sink assembly of claim 11, wherein the front end of the fins group is arc-shaped and the front edge of the front end forms a convex pointing toward the fan cover.

13. The heat sink assembly of claim 11, wherein the front end of the fins group has a triangle configuration and the front edge of the front end inclines forwardly from top to bottom of the fins group.

14. The heat sink assembly of claim 11, wherein the front end of the fins group has a triangle configuration and the front edge of the front end inclines rearwards from top to bottom of the fins group.

15. The heat sink assembly of claim 11, wherein the base has screw holes and the fan cover has claws defining holes, screws being extended through the holes of the claws and screwed in to the screw holes of the base thereby fastening the fan cover to the base.

16. The heat sink assembly of clam 15, wherein the fan cover has an opening through which the forced airflow generated by the fan enters the cavity, and screw holes beside the opening, screws being used to extend through the fan and screw into the screw holes of the fan cover thereby fastening the fan to the fan cover.

* * * * *